US009810931B2

(12) United States Patent
Zhang

(10) Patent No.: US 9,810,931 B2
(45) Date of Patent: Nov. 7, 2017

(54) RING CAVITY DEVICE AND ITS FABRICATION METHOD THEREOF

(71) Applicant: SUZHOU INSTITUTE OF NANO-TECH AND NANO-BIONICS OF CHINESE ACADEMY OF SCIENCE, Jiangsu (CN)

(72) Inventor: Ruiying Zhang, SIP Suzhou (CN)

(73) Assignee: Suzhou Institute of Nano-Tech and Nano-Bionics, Chinese Academy of Sciences, SIP Suzhou (CN)

( * ) Notice: Subject to any disclaimer, the term of this patent is extended or adjusted under 35 U.S.C. 154(b) by 0 days.

(21) Appl. No.: 14/899,440

(22) PCT Filed: Jun. 11, 2014

(86) PCT No.: PCT/CN2014/079665
§ 371 (c)(1),
(2) Date: Dec. 17, 2015

(87) PCT Pub. No.: WO2014/201964
PCT Pub. Date: Dec. 24, 2014

(65) Prior Publication Data
US 2016/0131926 A1 May 12, 2016

(30) Foreign Application Priority Data

Jun. 18, 2013 (CN) .......................... 2013 1 0241897
May 7, 2014 (CN) .......................... 2014 1 0188569

(51) Int. Cl.
G02F 1/025 (2006.01)
H01S 5/026 (2006.01)
(Continued)

(52) U.S. Cl.
CPC .......... *G02F 1/025* (2013.01); *G02F 1/01708* (2013.01); *H01S 5/026* (2013.01);
(Continued)

(58) Field of Classification Search
CPC .... G02F 1/025; G02B 6/29335; G02B 6/2934
See application file for complete search history.

(56) References Cited

U.S. PATENT DOCUMENTS 6,411,752 B1 * 6/2002 Little ................. H04B 10/2569
385/11
6,636,668 B1 * 10/2003 Al-Hemyari ....... G02B 6/12007
385/16
(Continued)

Primary Examiner — Daniel Petkovsek
(74) Attorney, Agent, or Firm — Wang Law Firm, Inc.

(57) ABSTRACT

A ring cavity device includes a passive ring waveguide and an input/output waveguide horizontally coupled to the passive ring waveguide, including an active waveguide structure vertically coupled to the passive ring waveguide and/or the input/output waveguide. The active waveguide structure compensates for the loss of the passive ring waveguide. A method for fabricating a ring cavity device is also included. The ring cavity device may obtain part of the gain by vertical coupling or mixed coupling (vertical coupling followed by horizontal coupling) thus to compensate the loss in the ring cavity device. Hence, the quality factor of the ring cavity device is improved.

10 Claims, 13 Drawing Sheets

(51) Int. Cl.
  *G02F 1/017*  (2006.01)
  *H01S 5/10*  (2006.01)
  *H01S 5/343*  (2006.01)
  *H01S 5/40*  (2006.01)
  *H01S 5/30*  (2006.01)

(52) U.S. Cl.
  CPC .......... *H01S 5/1071* (2013.01); *H01S 5/1032* (2013.01); *H01S 5/3013* (2013.01); *H01S 5/34306* (2013.01); *H01S 5/4068* (2013.01)

(56) References Cited

U.S. PATENT DOCUMENTS

| | | | | |
|---|---|---|---|---|
| 6,856,641 | B2* | 2/2005 | Ksendzov | H01S 5/1032 372/102 |
| 6,885,794 | B2* | 4/2005 | Scheuer | G02B 6/12007 372/92 |
| 6,940,878 | B2* | 9/2005 | Orenstein | H01S 5/06255 372/20 |
| 7,376,167 | B2* | 5/2008 | Yu | G02B 6/12004 372/20 |
| 7,469,085 | B1* | 12/2008 | Vlasov | G02B 6/12007 385/15 |
| 7,738,527 | B2* | 6/2010 | He | H01S 5/026 372/108 |
| 9,219,347 | B2* | 12/2015 | Akiyama | H01S 5/1071 |
| 2008/0089367 | A1* | 4/2008 | Srinivasan | B82Y 20/00 372/19 |
| 2016/0131844 | A1* | 5/2016 | Yang | G02B 6/12007 359/330 |

\* cited by examiner

RING CAVITY DEVICE AND ITS FABRICATION METHOD THEREOF

TECHNICAL FIELD OF THE INVENTION

The present invention relates to a semiconductor cavity optoelectronic device, in particular to a ring cavity device and a fabrication method thereof.

BACKGROUND OF THE INVENTION

Ring cavities, as traveling wave cavities, are inherently superior compared with standing wave cavities, so that the ring cavities are widely used as passive linear devices (such as filters, dispersion compensators and sensors), active linear devices (such as lasers, modulators and detectors), or non-linear devices (cavity quantum electrodynamics). Especially passive ring cavities, which have no inter-coupling resulted from gain competition so that high-quality traveling waves may be realized and high selectivity of wavelength and slow light behaviors may be thus obtained, are widely used in many fields (including lasers or optic gyroscopes or the like). Therefore, the passive ring cavities may be made of many kinds of material such as glass, polymer, SOI, SiN, $SiO_2$, Si, $LiNbO_3$ and III-V. However, without exception, loss in the ring cavities becomes a factor for restricting the implementation of high-performance passive ring cavities.

In order to reduce the loss, ring cavities consist of a large-diameter circular ring based on low-refractive index transparent material or of a rectangular ring based on transparent material. Employing one of those measures will somewhat reduce the loss and improve the performance of the device. However, on one hand, such change will bring about other relevant problems, and in this case, trade-off is the final choice; and on the other hand, scattering loss, which can not be eliminated in any way, becomes the final factor for restricting the performance of such devices.

Therefore, how to design a ring cavity which can reduce or even eliminate the loss in the cavity and further improve its quality factor so that the ring cavity can fully play its functions, becomes a new research and development direction.

SUMMARY OF THE INVENTION

In view of the aforementioned problems, the present invention provides a ring cavity device and a fabrication method thereof.

The present invention discloses a ring cavity device, including a passive ring waveguide, an input/output waveguide horizontally coupled to the passive ring waveguide, and an active waveguide structure vertically coupled to the passive ring waveguide and/or the input/output waveguide. The "vertically coupled" means that the active waveguide structure is located above or below the passive ring waveguide and/or the input/output waveguide.

Preferably, in this ring cavity device, the active waveguide structure provides a gain to the passive ring waveguide to compensate loss. "Compensating loss" herein includes providing partial or full compensation to the loss in the passive ring waveguide. The active waveguide structure may provide compensation to the passive ring waveguide by being directly coupled thereto, or may be coupled to the input/output waveguide to provide compensation to the passive ring waveguide by the coupling of the input/output waveguide and the ring cavity.

Preferably, in the ring cavity device, the active waveguide structure at least covers a part of an upper surface of the passive ring waveguide, the active waveguide structure includes a space layer, an active gain layer, a cladding layer and a contact layer successively formed on the upper surface of the passive ring waveguide.

Preferably, in the ring cavity device, the space layer is made of InP, the active gain layer is made of In(Ga)As(P), the cladding layer is made of InP, and the contact layer is made of InGaAs.

Preferably, in the ring cavity device, the active waveguide structure is formed in a first position of the input/output waveguide which is coupled to the passive ring waveguide in the first position.

Preferably, in the ring cavity device, the active waveguide structure includes a space layer, an active gain layer, a cladding layer and a contact layer successively formed on an upper surface of the input/output waveguide.

Preferably, in the ring cavity device, the space layer is made of InP; the active gain layer is made of In(Ga)As(P); the cladding layer is made of InP; and the contact layer is made of InGaAs.

Correspondingly, the present invention further provides a method for fabricating a ring cavity device, including the following steps of:

S1: successively growing a buffer layer, a passive waveguide layer, a space layer, an active gain layer, a cladding layer and a contact layer on a substrate; and S2: etching the structure of s1, to form a ring waveguide and an input/output waveguide having a vertical coupling structure.

Preferably, the method for fabricating a ring cavity device further includes a step of further etching the ring waveguide to partially expose the space layer, in order to form a passive ring waveguide and an active ring waveguide structure located above the passive ring waveguide.

Preferably, the method for fabricating a ring cavity device further includes a step of further etching the input/output waveguide to expose the space layer beyond the first position, in order to form a passive input/output waveguide and an active waveguide structure located in the first position; and the passive input/output waveguide is coupled to the ring waveguide in the first position.

Preferably, in the method for fabricating a ring cavity device, the substrate is selected from a Si substrate, a GaAs substrate, an InP substrate or a GaN substrate; the buffer layer is made of InP; the passive waveguide layer is made of InGaAsP, InGaAlAs, or InGaNAs; the space layer is made of InP; the active gain layer is made of In(Ga)As(P); the cladding layer is made of InP; and the contact layer is made of InGaAs.

For the ring cavity device and the fabrication method thereof in the present invention, the passive ring cavity is formed from an active vertical coupling structure so that a part of the waveguide region of the passive ring cavity can obtain a part of the gain by vertical coupling or mixed coupling, thus to compensate the loss in the passive ring cavity without influencing other structures and performances of the passive ring cavity. Further, a passive ring cavity with low loss or even without loss is actually obtained, the quality factor of the ring resonator is improved, and the performance of the ring resonator is improved even to the maximum extent.

BRIEF DESCRIPTION OF THE DRAWINGS

In order to explain technical solutions of embodiments of the present invention or in the prior art more clearly, the accompanying drawings to be used for describing the embodiments or the prior art will be introduced briefly. Apparently, the accompanying drawings to be described below are merely some embodiments in this application, and a person of ordinary skill in the art may further obtain other accompanying drawings according to these accompanying drawings without requiring any creative effort.

DETAILED DESCRIPTION OF THE INVENTION

Figure 1:
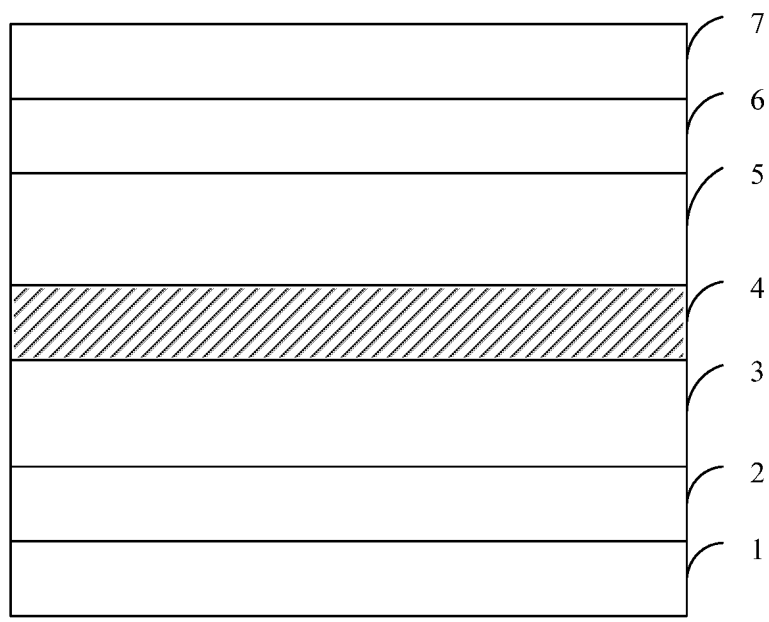
FIG. 1 is a schematic diagram of an embodiment of the material structure of a ring cavity device according to the present invention.

FIG. 1 is a schematic diagram of an embodiment of the material structure of an ring cavity device according to the present invention, including a buffer layer 2, a passive waveguide layer 3, a space layer 4, an active gain layer 5, a cladding layer 6 and a contact layer 7 successively grown on a substrate 1, all of which form an active vertical coupling structure. An active waveguide portion is formed by the contact layer 7 to the space layer 4, and a passive waveguide structure is formed by the space layer 4 to the passive waveguide layer 3. The passive waveguide layer 3, the space layer 4 and the active gain layer 5 together form a core region of the active vertical coupling structure. The active vertical coupling structure, as a core component of a waveguide structure (the ring waveguide and the input/output waveguide), is used for providing a gain to compensate loss in the ring cavity, thus to obtain a high quality factor.

The substrate 1 may be selected from one of an Si substrate, a GaAs substrate, an InP substrate or a GaN substrate. Taking the InP substrate as an example:

an InP buffer layer, a passive waveguide layer, an InP space layer and an active gain layer, an InP cladding layer and an InGaAs contact layer are grown on the InP substrate. The InP substrate may be a P-type substrate, a N-type substrate or a semi-insulating substrate as required, and the passive waveguide layer may be InGaAsP material, InGaAlAs material or InGaNAs material with a bandgap wavelength of from 1.0 μm to 1.5 μm as required; the thickness of the passive waveguide layer 3 depends on the requirements of the passive ring cavity and is generally 0.2 μm to 20 μm, and the doping concentration and type depend on the type of the substrate and the requirements of the ring cavity; the thickness of the InP space layer depends on the requirements of the passive ring cavity and the doping type of the substrate, and is generally 0.1 μm to 30 μm, the active gain layer, according to the requirements of the ring cavity, is generally In(Ga)As(P) bulk material with a bandgap wavelength of 1.3 μm to 1.65 μm, and further may be an In(Ga)As(P)/In(Ga)As(P) multiple quantum well, or an In(Ga)As(P)/InGa(Al)As multiple quantum well; the doping and the thickness of the InP cladding layer depend on the requirements of the ring cavity and the type of the InP substrate; and the thickness of the InGaAs contact layer is generally 0.1 μm to 1 μm, and the doping concentration thereof is $1*10^{17}$ cm$^{-3}$ to $1*10^{20}$ cm$^{-3}$. The doping type depends on the doping condition of the substrate and the demands of the ring cavity itself, so that the active region can be powered-on normally and effectively to obtain the gain.

FIGS. 2A-2G are schematic diagrams of a waveguide pattern, after first photolithography, according to the present invention. Specifically, the ring waveguide and the input/output waveguide patterns are formed by photolithography on the contact layer of FIG. 1. The photolithography method may be one of electron-beam exposure, ultraviolet photolithography, interference photolithography, nano-imprint photolithography and self-assembly and other methods, or a combination thereof.

Figure 2A:
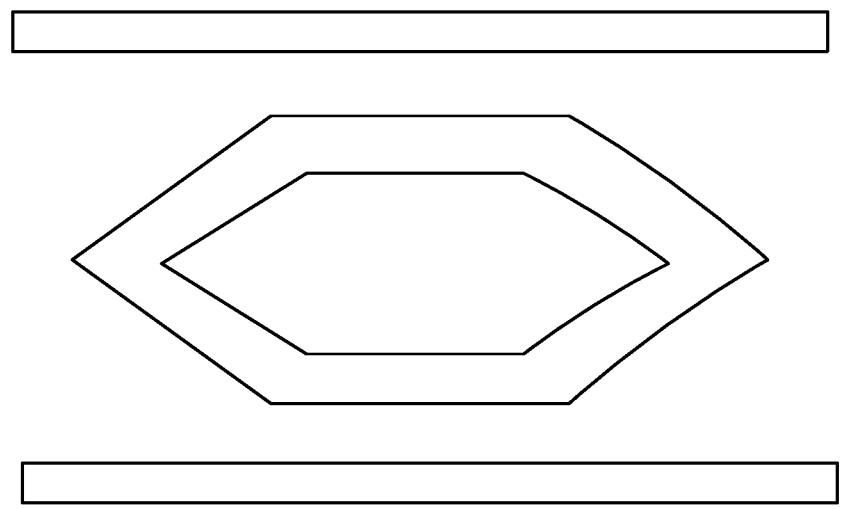
FIG. 2A-2G are schematic diagrams of an embodiment of a waveguide pattern, after first photolithography, according to the present invention.
Figure 2B:
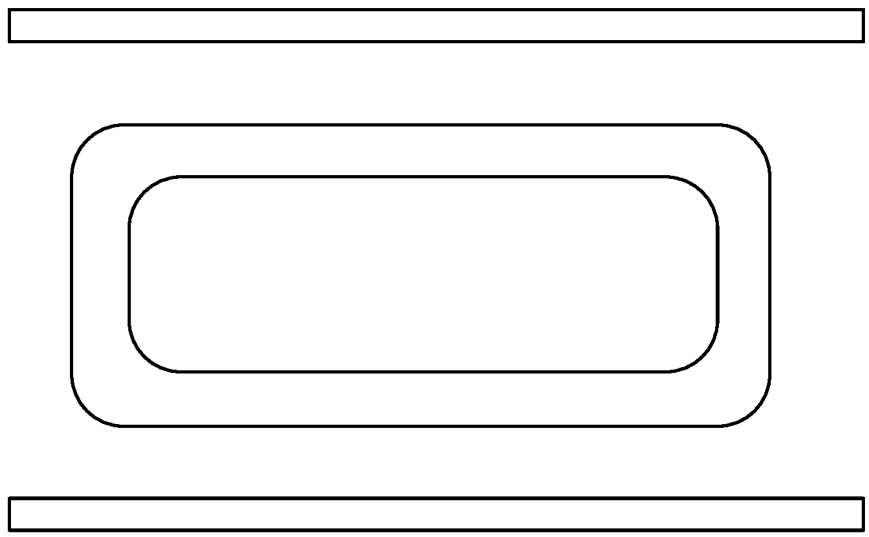
Figure 2C:
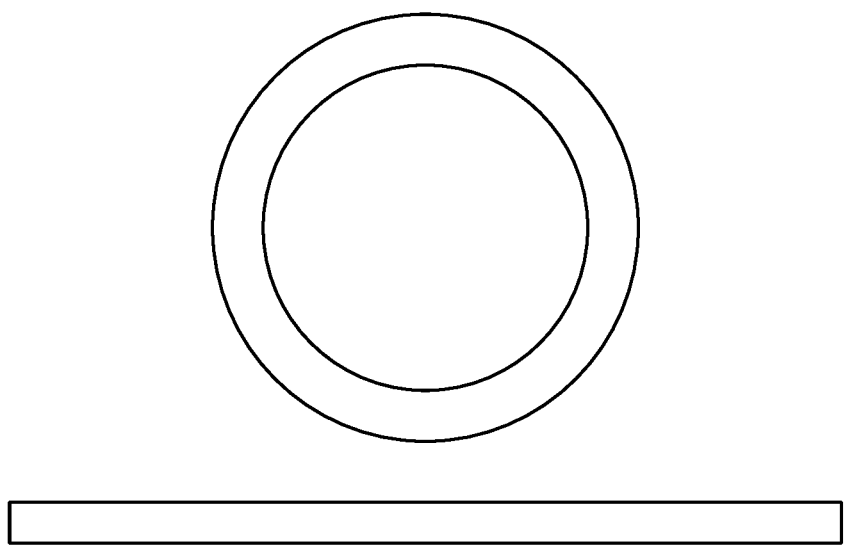
Figure 2D:
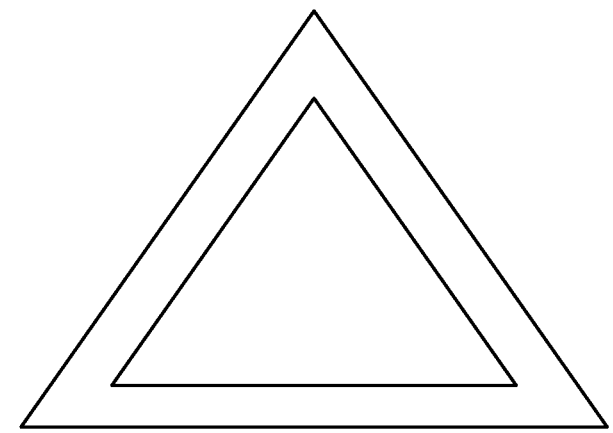
Figure 2E:
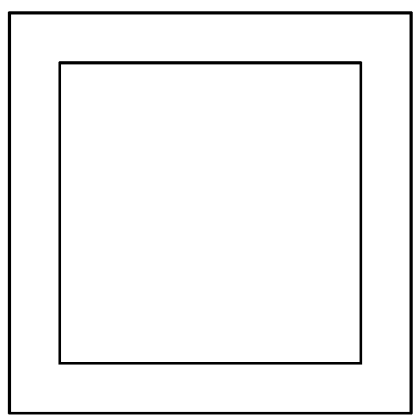
Figure 2F:
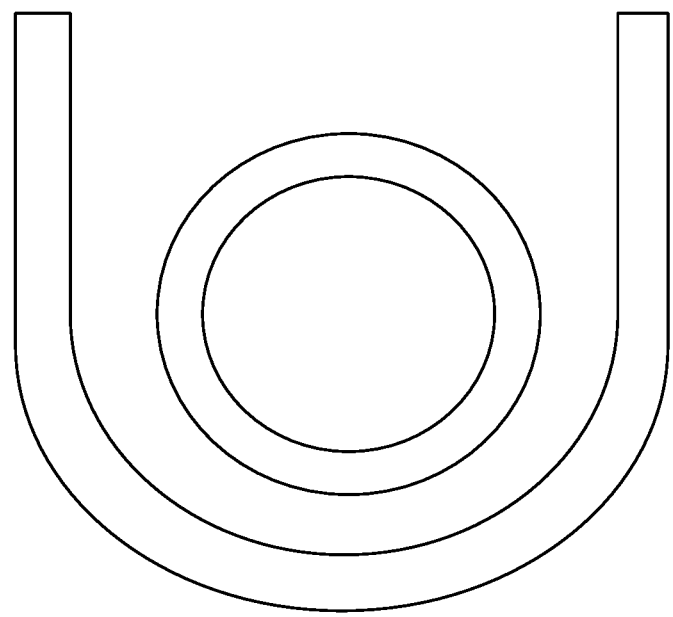
Figure 2G:
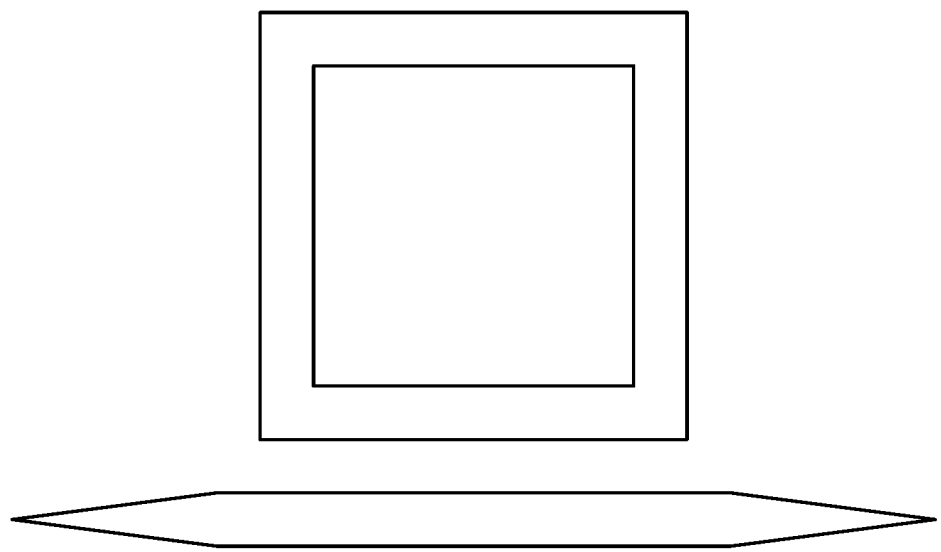

The ring waveguide and the input/output waveguide, forming the ring cavity, are arranged adjacent to each other, in order to realize the horizontal coupling. The ring waveguide is shaped like a hexagon (as shown in FIG. 2A), a racetrack (as shown in FIG. 2B), a rectangle (as shown in FIG. 2C and FIG. 2G), a triangle (as shown in FIG. 2D), an annulus (as shown in FIG. 2E and FIG. 2F), a rhombus or an irregular closed waveguide shape. The input/output waveguide includes one of a straight waveguide (as shown in FIG. 2A-2E), a bent waveguide (as shown in FIG. 2F), a wedge waveguide (as shown in FIG. 2G), an MMI waveguide, an M-Z waveguide and a Y waveguide and other waveguides which can realize required input/output and with loss as low as possible, or a combination of more than one thereof.

Figure 3:
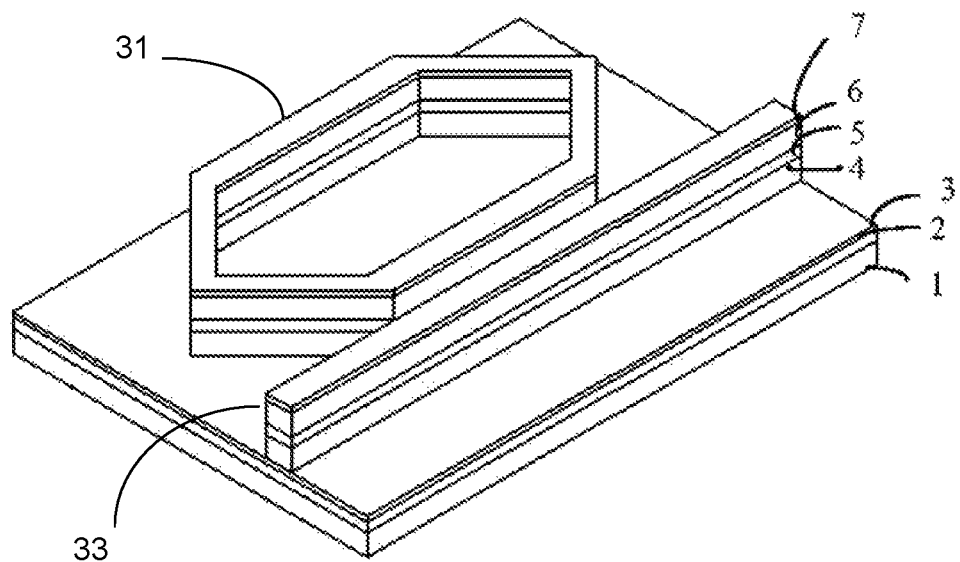
FIG. 3 is a stereoscopic view of a ring waveguide and an input/output waveguide based on an active vertical coupling structure formed after the first photolithography and etching according to the present invention.

FIG. 3 is a stereoscopic view of a ring waveguide 31 and an input/output waveguide 33 based on an active vertical coupling structure formed after first photolithography and etching according to the present invention. FIG. 3 shows, by taking the photolithography pattern given in FIG. 2A as an example, a typical ring waveguide and input/output waveguide defined by dry etching equipment with a photolithography pattern mask. The dry etching includes reactive ion etching, inductively-coupled plasma etching, cyclotron resonance plasma etching and other methods. The shape and the depth of the waveguide to be etched depend on the requirements of the ring cavity, but it is necessary to ensure that a passive waveguide may be formed later. Usually, etching terminates at the middle space layer 4 in the lower portion. That is, an active vertical coupling structure waveguide, formed together by the contact layer 7, the cladding layer 6, the active gain layer 5, the space layer 4, the passive waveguide layer 3 and the buffer layer 2, is formed.

FIG. 4A-4E are plan views of the ring waveguide 31 and the input/output waveguide 33 after second photolithography and etching according to the present invention. FIG. 4A-4E show, based on FIG. 3, a pattern of a passive portion 35 after second photolithography. And, a passive waveguide portion 35 is formed again by dry etching. The etching depth of the passive waveguide depends on the specific functions of the active vertical coupling structure and the ring cavity. But, the active gain layer 5 and portions above the active gain layer 5 must be removed completely to form a passive ring waveguide 43 and an input/output waveguide 33, thus to meet the demands of the specific functions. The etching usually terminates at a certain portion of the space layer 4. The contact layer 7 is remained as one portion forming the active vertical coupling structure, and the space layer 4 is remained one portion of the passive waveguide.

Herein, the etching equipment may apply reactive ion etching, inductively-coupled plasma etching and cyclotron resonance plasma etching and other methods.

Figure 4A:
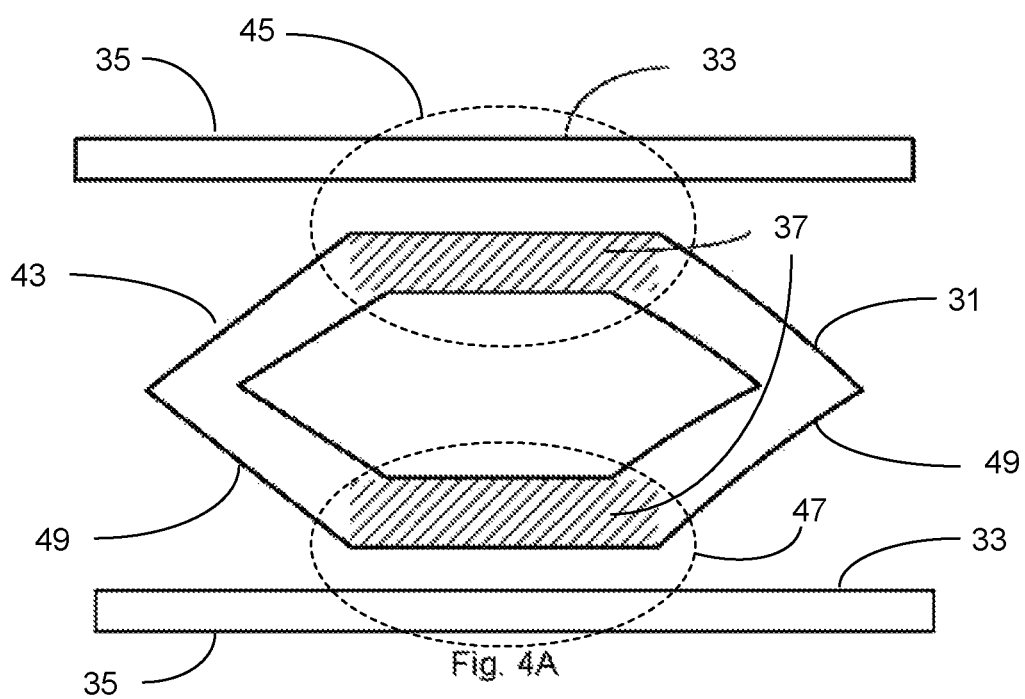
FIGS. 4A-4E are plan views of the ring waveguide and the input/output waveguide after second photolithography and etching according to the present invention.
Figure 4B:
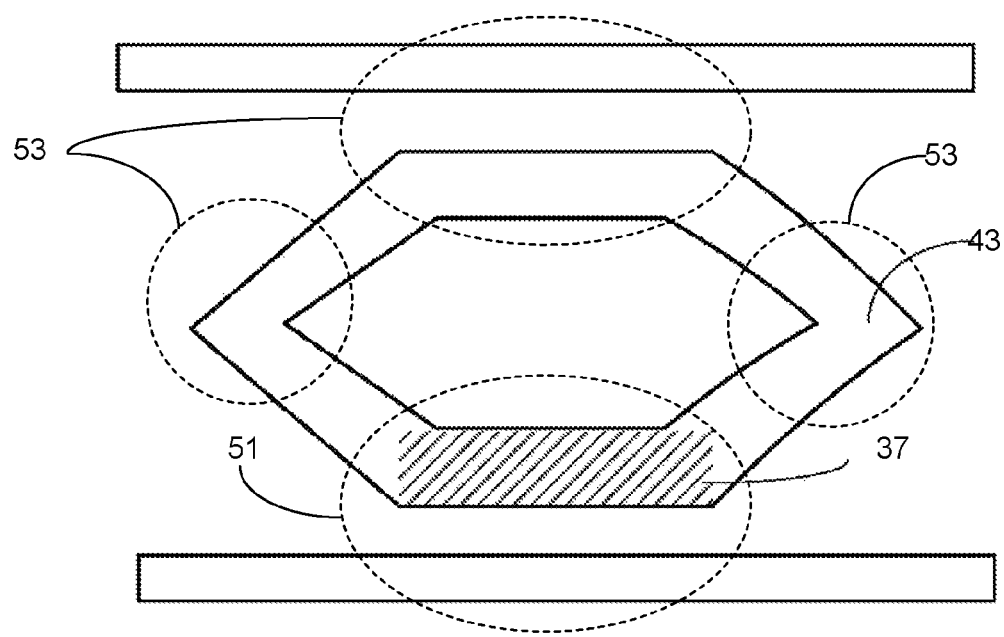
Figure 4C:
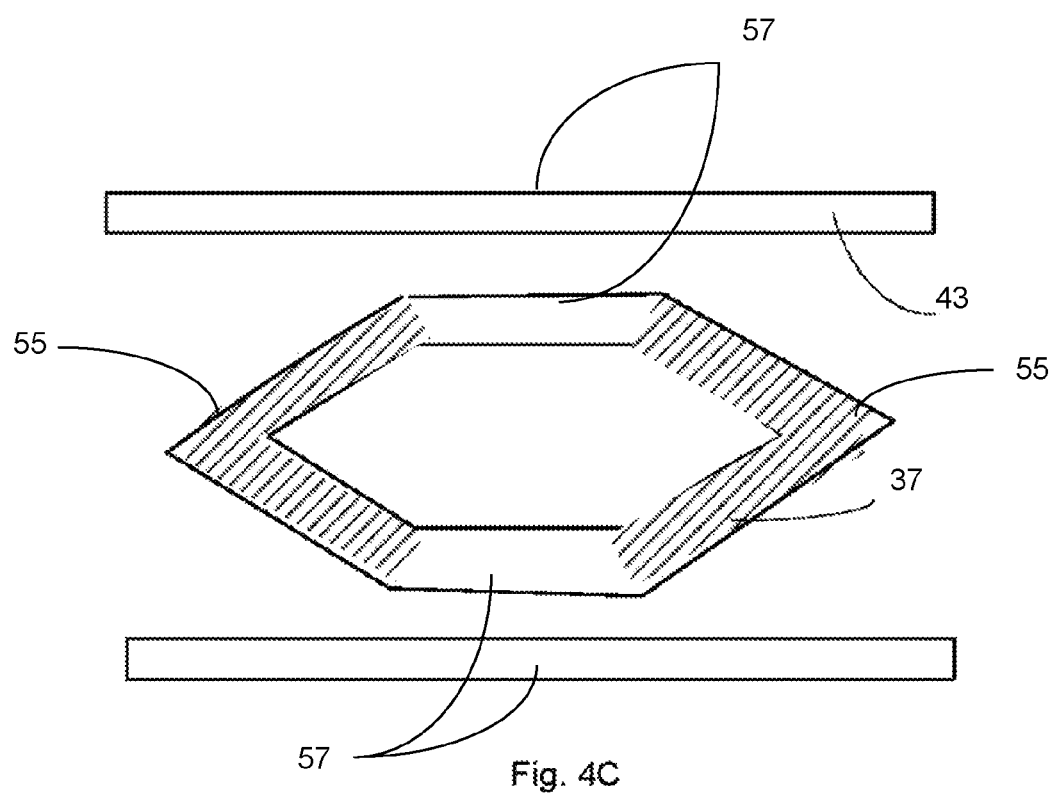
Figure 4D:
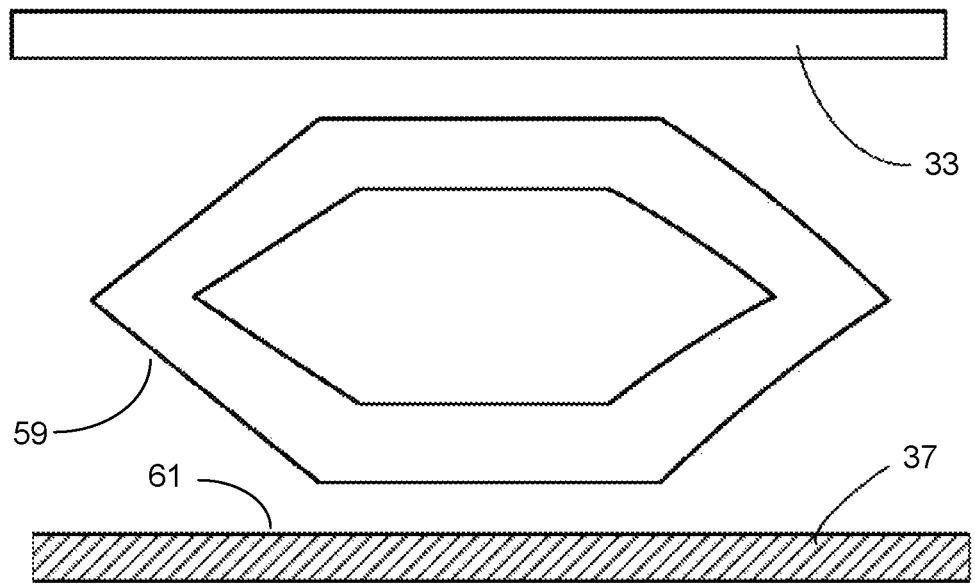
Figure 4E:
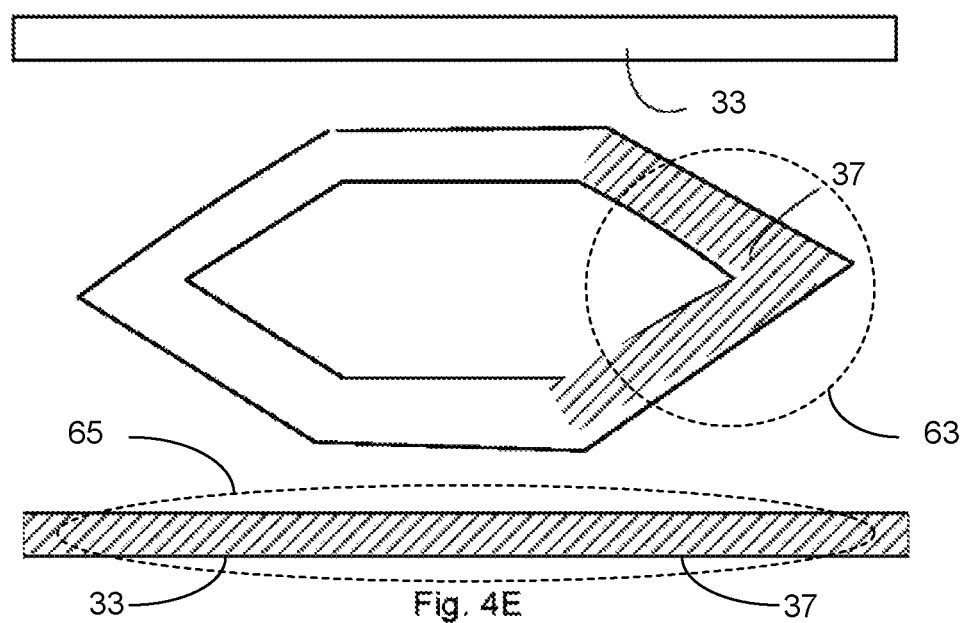

FIG. 4A shows that two coupling regions 45, 47 of the ring waveguide 31 are both of an active vertical coupling structure 37 while other portions 49 thereof are of a passive waveguide structure 43; FIG. 4B shows that only one coupling region 51 of the ring waveguide is of an active vertical coupling structure 37 while other portions 53 thereof are of a passive waveguide structure 43; FIG. 4C shows that part of the non-coupling region 55 of the ring waveguide is of an active vertical coupling structure 37, others parts 57 thereof are passive waveguide regions 43; FIG. 4D shows that the ring waveguide 59 is completely passive, and part of the input/output waveguide 61 is of an active vertical coupling structure 37; and FIG. 4E is a schematic diagram showing that some regions 63 of the ring waveguide are of an active vertical coupling structure 37, and some regions 65 of the input/output waveguide 33 are of an active vertical coupling structure 37.

The ring cavity device may obtain part of the gain by vertical coupling or mixed coupling (vertical coupling followed by horizontal coupling) thus to compensate the loss in the ring cavity device. Hence, the quality factor of the ring cavity device is improved. When the ring waveguide is of an active vertical coupling structure, the loss of the passive ring waveguide can be directly compensated just by vertically coupling the gain of an active region to a passive waveguide region; and when the ring waveguide is a passive waveguide and the input/output waveguide is of an active vertical coupling structure, the gain provided by an active region is coupled to a passive waveguide region of the input/output waveguide by the active vertical coupling structure, and the gain is then further coupled to the ring waveguide by concurrently coupling the input/output waveguide to the ring waveguide, to compensate the loss in the ring waveguide, and in this way, mixed coupling is realized.

Figure 5:
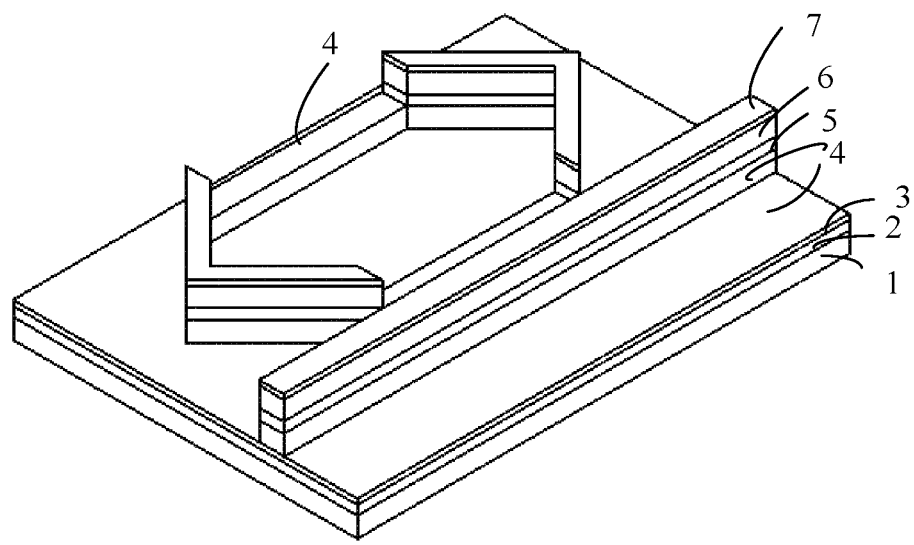
FIG. 5 is a stereoscopic view of FIG. 4A.

FIG. 5 shows a stereoscopic view of FIG. 4A.

It may be understood that, when it comes to the form of FIGS. 4A-4E, at least one part of the waveguide structure includes the active vertical coupling structure formed by the contact layer 7 to the buffer layer 2; at least one part of the waveguide structure includes the passive waveguide structure formed by the space layer 4 to the buffer layer 2.

Figure 6:
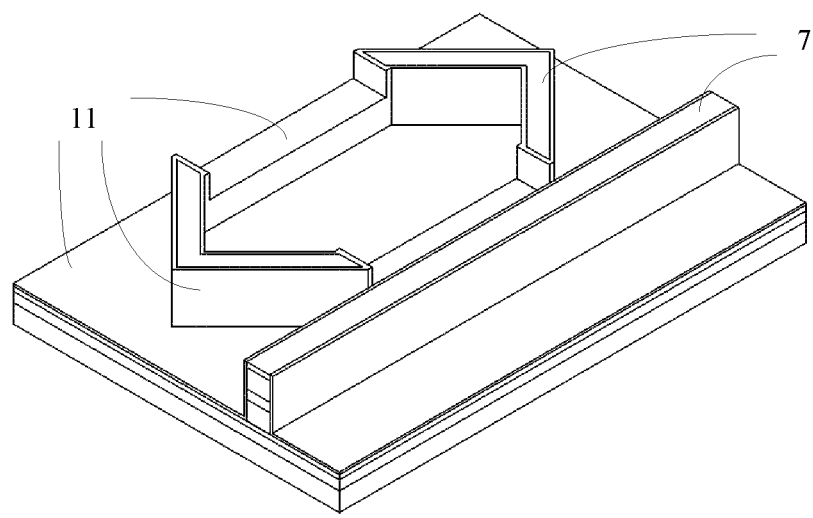
FIG. 6 is a stereoscopic structural diagram of the ring waveguide and the input/output waveguide circuit passivated by a dielectric film according to the present invention.

FIG. 6 is a structural diagram of the ring waveguide and the input/output waveguide loop passivated by a dielectric film. A passivation region of the dielectric film 11 does not include the part where the contact layer 7 is remained.

Herein, the passivation by the dielectric film 11 may be SiN, $SiO_2$, $Al_2O_3$ or the like. The passivation equipment may employ plasma enhanced chemical vapor deposition, inductively-coupled plasma chemical vapor deposition, electron-beam evaporation, atomic layer deposition and other methods.

Figure 7:
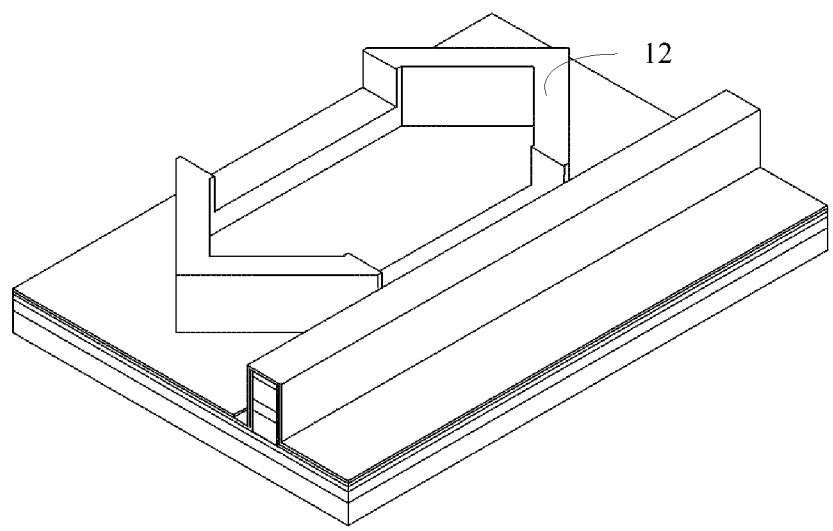
FIG. 7 is a stereoscopic structural diagram of a finished ring cavity device.

FIG. 7 is a structural diagram of a finished ring cavity device, including a structural diagram of a ring waveguide and an input/output waveguide after windowing via an active region and evaporation of an electrode in the front, herein the film 12 evaporated with an electrode in the front is for all regions. The dielectric passivation layer in a window region must be removed by ordinary photolithography and dry or wet etching for windowing of the active region; the deposited electrode in the front, according to the doping features of the InGaAs contact layer, may be Au/Ge/Ni alloy or Ti/Pt/Au alloy or other alloys. Hereafter, the device is subject to evaporation with a corresponding electrode in the back, rapid thermal annealing, alloying, cleavage and wire bonding to form a complete device.

Figure 8:
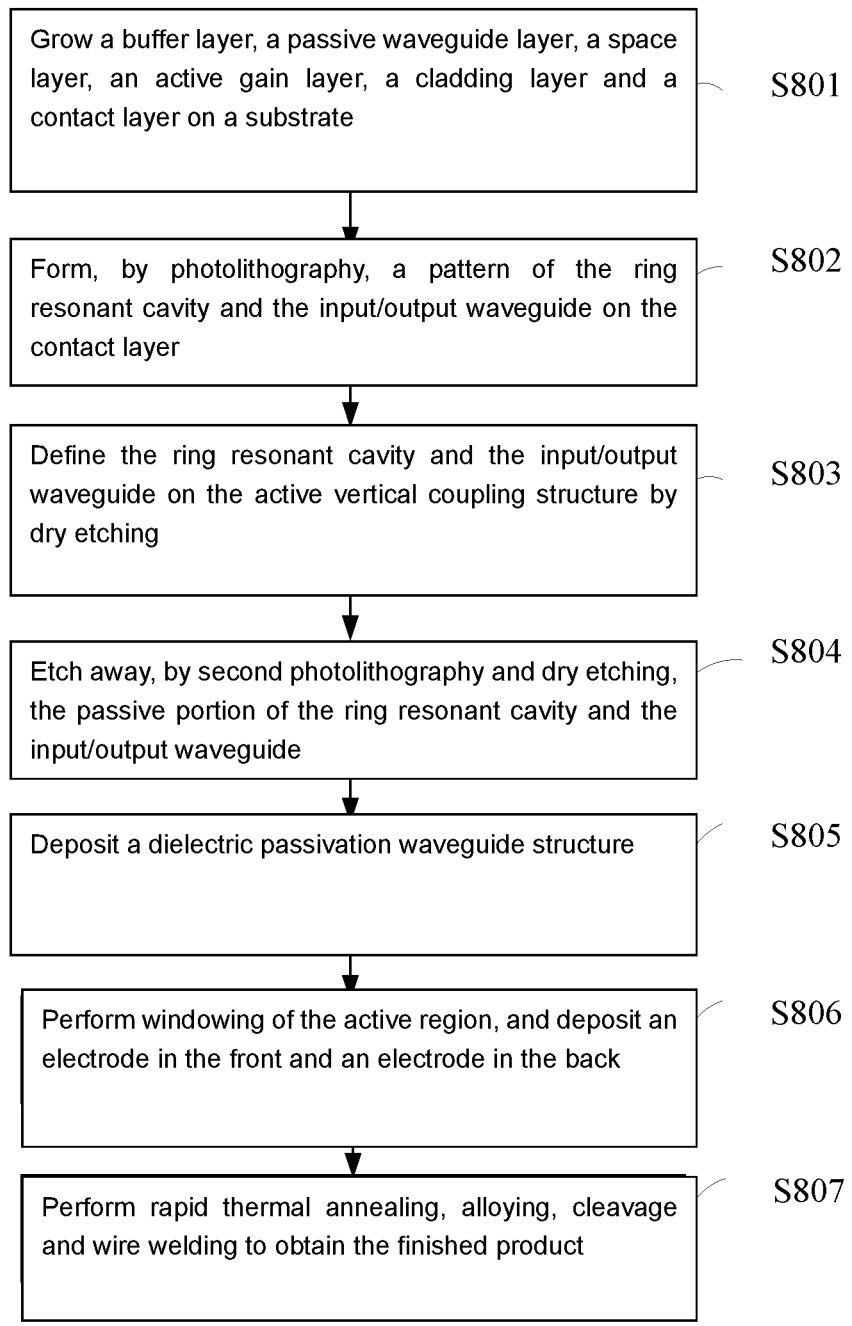
FIG. 8 is a schematic diagram of steps of specific implementations of a method according to the present invention.

FIG. 8 is a schematic diagram of steps of specific implementations of a method according to the present invention, including the following steps.

Step S801: A buffer layer 2, a passive waveguide layer 3, a space layer 4, an active gain layer 5, a cladding layer 6 and a contact layer 7 are successively grown on a substrate 1, to form a growing material structure as shown in FIG. 1. The passive waveguide layer 3, the space layer 4 and the active gain layer 5 form an active vertical coupling structure. The active vertical coupling structure, as a necessary component forming the ring waveguide and the input/output waveguide, is used for providing a gain to compensate loss in the ring cavity, thus to obtain a high quality factor.

Step S802: A pattern of the ring waveguide and the input/output waveguide is formed by photolithography on the contact layer 7, as shown in one of FIGS. 2A-2G. The ring waveguide and the input/output waveguide are arranged adjacent to each other, in order to realize the horizontal coupling.

Step S803: The pattern formed by photolithography is transferred to the material structure by dry etching, to obtain the ring waveguide and the input/output waveguide completely based on the complete active vertical coupling structure, as shown in FIG. 3.

The etching depth depends on parameters of the ring cavity and the coupled waveguide, and the etching roughness depends on the usage.

Step S804: The contact layer, the cladding layer and the active gain layer of the passive waveguide portion in the pattern formed by photolithography are etched away by second photolithography and dry etching, to form a passive waveguide portion of the ring waveguide and the input/output waveguide, as shown in FIGS. 4A-4E and FIG. 5.

Step S804: With a second photolithography mask, the pattern formed by second photolithography is transferred to a ring structure by dry etching equipment, to define a passive ring waveguide and an input/output waveguide structure, as shown in FIG. 5.

Step S805: The dielectric film is deposited to passivate the ring waveguide and the input/output waveguide, as shown in FIG. 6.

Step S806: An electrode window is formed in a region of the active vertical coupling structure, and the active vertical coupling structure is evaporated with an electrode in the front and an electrode in the back.

Step S807: Rapid thermal annealing, alloying, cleavage and wire bonding are performed on the entire sample, to obtain an eligible high-quality ring device, as shown in FIG. 7.

Figure 9:
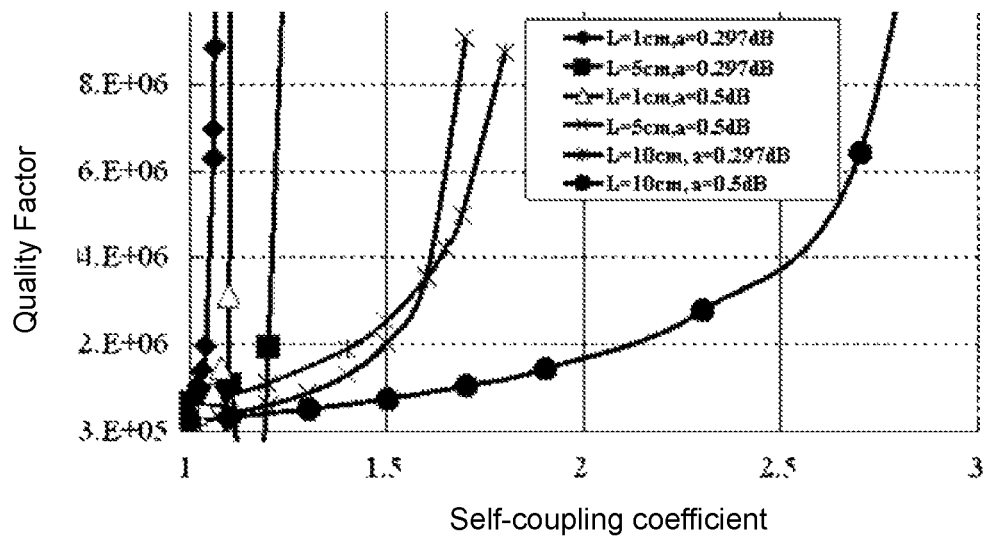
FIG. 9 is a diagram showing the relationship between change in the quality factor of the ring resonator and the proportion of gains provided by an active region.

FIG. 9 shows the relationship between change in the quality factor of the ring cavity and the proportion of gains provided by an active region. It can be seen that, for ring cavities having different perimeters and different losses, by providing a corresponding gain by the active region, a self-coupling coefficient of ring cavities of greater than 1 is obtained. The quality factor of the ring cavity is improved perpendicularly and may exceed $10^6$, and the smaller the perimeter is, the less the loss is and the less the gain required to compensate the loss is.

That is, for the ring cavity device and the fabricating method thereof in the present invention, the passive ring cavity is fabricated from an active vertical coupling structure so that a part of the waveguide region of the passive ring cavity can obtain a part of the gain by vertical coupling or mixed coupling, thus to compensate the loss in the passive ring cavity without influencing other structures and performances of the passive ring cavity. Further, a passive ring cavity with low loss even without loss is actually obtained, the quality factor of the ring cavity is improved, and functions of the ring cavity are significantly improved and likely to the maximum extent.

Figure 10A:
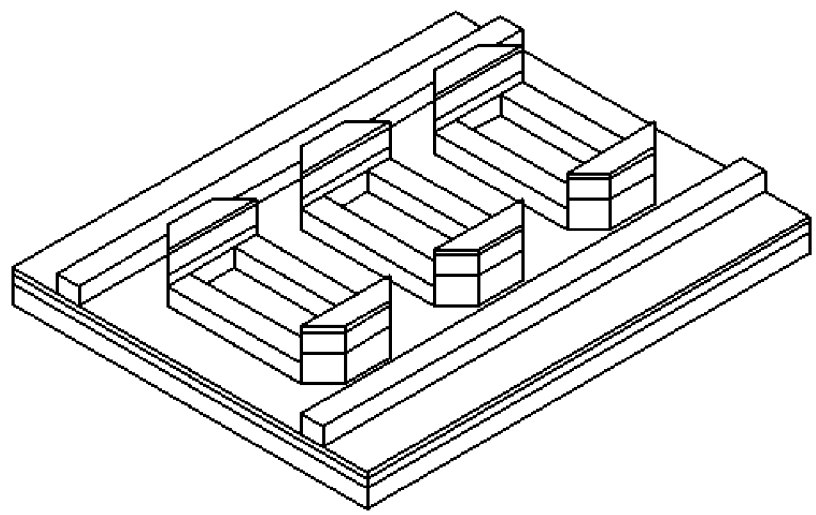
FIGS. 10A-10D are schematic diagrams of a photonic integrated circuit based on the ring cavity unit.
Figure 10B:
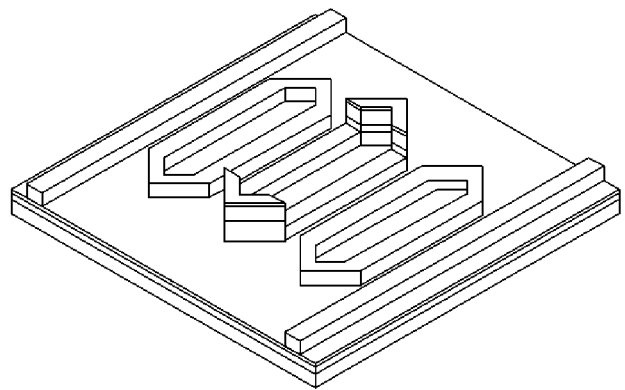
Figure 10C:
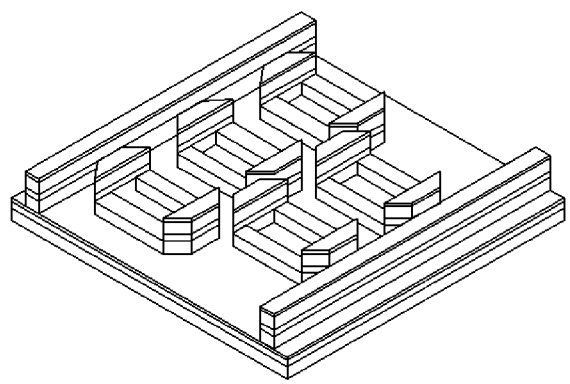
Figure 10D:
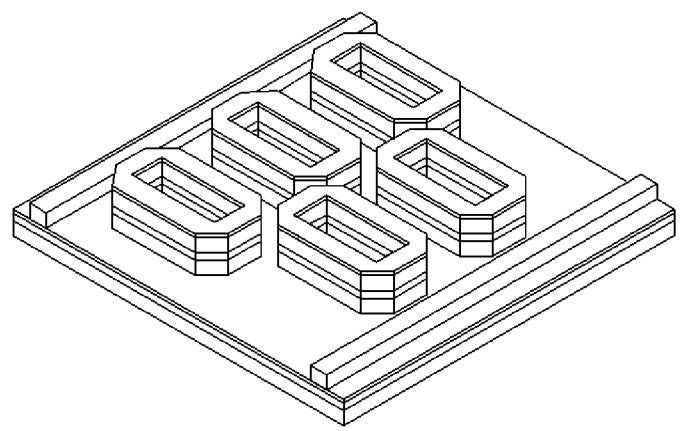

FIGS. 10A-10D show a ring photonic integrated circuit formed by regarding the passive ring cavity as a unit. For example, the passive ring cavity photonic integrated circuits are connected in series (as shown in FIG. 10A), the passive ring cavity photonic integrated circuits are connected in parallel (as shown in FIG. 10B), and the passive ring cavity photonic integrated circuits are connected in series and in parallel (as shown in FIG. 10C and FIG. 10D). Herein, each ring cavity unit is composed of such passive ring cavities having an active vertical coupling structure. Therefore, each loop of the photonic integrated circuit may obtain the gain provided by the active vertical coupling structure to compensate the loss in the photonic integrated circuit, in order to improve the optical quality factor thereof. Thus, the performance of the entire photonic integrated circuit is improved. There is no limitation to the number of ring units and the way of connecting the ring units in series or in parallel. It falls into the protection scope of the application as long as the loss in each loop is compensated by the gain provided by the active vertical coupling structure thus to improve the performance of a corresponding device.

The above description is a preferred implementation of the present invention, and it should be noted that, for a person of ordinary skill in the art, various improvements and modifications may be made without departing from the principle of the present invention, and those improvements and modifications should be regarded as falling into the protection scope of the present invention.

The invention claimed is:

1. A ring cavity device, comprising:
a passive ring waveguide with a plurality of regions;
a plurality of separate active waveguide structures vertically coupled to the passive ring waveguide, each active waveguide structure being coupled to one region of the passive ring waveguide, two regions coupled to the plurality of separate active waveguide structures being separated from each other; and
at least one input/output waveguide horizontally coupled to the passive ring waveguide, and the plurality of separate active waveguide structure providing a gain to the passive ring waveguide to compensate loss.

2. The ring cavity device according to claim 1, wherein each active waveguide structure covers at least a part of an upper surface of the passive ring waveguide, each active waveguide structure further comprises a space layer, an active gain layer, a cladding layer and a contact layer successively formed on the upper surface of the passive ring waveguide.

3. The ring cavity device according to claim 2, wherein the space layer is made of InP; the active gain layer is made of In(Ga)As(P); the cladding layer is made of InP; and the contact layer is made of InGaAs.

4. The ring cavity device according to claim 1, wherein an active waveguide structure is formed in a first position on the at least one input/output waveguide which is coupled to the passive ring waveguide at the first position.

5. The ring cavity device according to claim 4, wherein each active waveguide structure further comprises a space layer, an active gain layer, a cladding layer and a contact layer successively formed on an upper surface of the at least one input/output waveguide structure.

6. The ring cavity device according to claim 5, wherein the space layer is made of InP; the active gain layer is made of In(Ga)As(P); the cladding layer is made of InP; and the contact layer is made of InGaAs.

7. The ring cavity device according to claim 1, wherein the ring cavity device, when in use, obtains part of the gain by vertical coupling or mixed coupling thus to compensate the loss in the ring cavity device, and the mixed coupling refers to vertical coupling followed by horizontal coupling;
the input/output waveguide is an active vertical coupling structure, the gain provided by an active region is coupled to a passive waveguide region of the at least one input/output waveguide by the active vertical coupling structure, and the gain is then further coupled to the ring waveguide by concurrently coupling the at least one input/output waveguide to the ring waveguide, to compensate the loss in the ring waveguide, and in this way, mixed coupling is realized.

8. The ring cavity device according to claim 1, further comprising an input/output waveguide coupled to an active waveguide structure.

9. The ring cavity device according to claim 8, wherein the input/output waveguide is an active vertical coupling structure.

10. The ring cavity device according to claim 1, there are two input/output waveguides.

* * * * *